United States Patent
Shiino et al.

(10) Patent No.: US 9,928,915 B2
(45) Date of Patent: *Mar. 27, 2018

(54) NON-VOLATILE SEMICONDUCTOR STORAGE DEVICE

(71) Applicant: TOSHIBA MEMORY CORPORATION, Minato-ku (JP)

(72) Inventors: Yasuhiro Shiino, Yokohama (JP); Daisuke Kouno, Yokohama (JP); Shigefumi Irieda, Yokohama (JP); Kenri Nakai, Fujisawa (JP); Eietsu Takahashi, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/331,374

(22) Filed: Oct. 21, 2016

(65) Prior Publication Data

US 2017/0040062 A1 Feb. 9, 2017

Related U.S. Application Data

(60) Continuation of application No. 14/990,609, filed on Jan. 7, 2016, now Pat. No. 9,508,442, which is a
(Continued)

(30) Foreign Application Priority Data

Jul. 15, 2009 (JP) .................................. 2009-167000
Dec. 3, 2009 (JP) .................................. 2009-275695

(51) Int. Cl.
*G11C 11/34* (2006.01)
*G11C 16/14* (2006.01)
(Continued)

(52) U.S. Cl.
CPC .............. *G11C 16/14* (2013.01); *G11C 16/16* (2013.01); *G11C 16/3445* (2013.01)

(58) Field of Classification Search
USPC .................................................. 365/185.29
See application file for complete search history.

(56) References Cited

U.S. PATENT DOCUMENTS 5,870,334 A 2/1999 Hemink et al.
6,166,962 A 12/2000 Chen et al.
(Continued)

FOREIGN PATENT DOCUMENTS

JP 8-87895 A 4/1996
JP 2000-236031 8/2000
(Continued)

OTHER PUBLICATIONS

Japanese Office Action dated Apr. 16, 2013, in Patent Application No. 2009-275695 (with English Translation).
(Continued)

*Primary Examiner* — Anthan Tran
(74) *Attorney, Agent, or Firm* — Oblon, McClelland, Maier & Neustadt, L.L.P.

(57) ABSTRACT

For data erase from an electrically erasable and programmable non-volatile memory cell, the following operations are performed: an erase operation to apply an erase pulse voltage to a memory cell for data erase, an erase verify operation to verify whether data erase is completed, and a step-up operation to increase the erase pulse voltage by a certain step-up voltage if data erase is not completed. A control unit controls voltages so that at least a first erase pulse voltage initially generated in the erase operation has a longer rise time than that of a second erase pulse voltage generated subsequent to the first erase pulse voltage.

18 Claims, 8 Drawing Sheets

Related U.S. Application Data continuation of application No. 14/278,724, filed on May 15, 2014, now Pat. No. 9,263,140, which is a continuation of application No. 13/941,931, filed on Jul. 15, 2013, now Pat. No. 8,767,478, which is a division of application No. 13/346,880, filed on Jan. 10, 2012, now Pat. No. 8,531,891, which is a continuation of application No. 12/796,964, filed on Jun. 9, 2010, now Pat. No. 8,149,631.

(51) Int. Cl.
*G11C 16/16* (2006.01)
*G11C 16/34* (2006.01)

(56) References Cited

U.S. PATENT DOCUMENTS

| | | |
|---|---|---|
| 6,515,908 B2 | 2/2003 | Miyawaki et al. |
| 6,567,316 B1 | 5/2003 | Ohba et al. |
| 6,894,931 B2 | 5/2005 | Yaegashi et al. |
| 7,057,936 B2 | 6/2006 | Yaegashi et al. |
| 8,149,631 B2 | 4/2012 | Shiino et al. |
| 8,531,891 B2 * | 9/2013 | Shiino .................. G11C 16/16 365/185.29 |
| 8,767,478 B2 * | 7/2014 | Shiino .................. G11C 16/16 365/185.29 |
| 9,263,140 B2 * | 2/2016 | Shiino .................. G11C 16/16 |
| 9,508,442 B2 * | 11/2016 | Shiino .................. G11C 16/16 |
| 2004/0264264 A1 * | 12/2004 | Yaegashi ............ G11C 16/3468 365/199 |

FOREIGN PATENT DOCUMENTS

| | | |
|---|---|---|
| JP | 2004-23044 A | 1/2004 |
| KR | 10-2006-0025601 | 3/2006 |

OTHER PUBLICATIONS

Korean Office Action dated Nov. 20, 2012, in Korean Patent Application No. 10-2012-0109030 (with English Translation).

Office Action dated Jun. 29, 2012, in Korean Patent Application No. 10-2010-24201 (with English Translation).

Kang-Deog Suh et al., "A 3.3V 32Mb NAND Flash Memory with Incremental Step Pulse Programming Scheme", ISSCC Digest of Technical Papers, Feb. 1995, 2 pages.

G.J. Hemink, et al., "Fast and Accurate Programming Method for Multi-level NAND EEPROMs," VLSI Technology Digest of Technical Papers, Jun. 1995, 1 page.

Korean Office Action dated Nov. 23, 2011, in Korean Patent Application No. 10-2010-0024201 (with English Translation).

Korean Office Action dated Jul. 15, 2013, in Korea Patent Application No. 10-2012-109030 (with English translation).

* cited by examiner

FIG. 9B   "A1 may be gentler than B1"
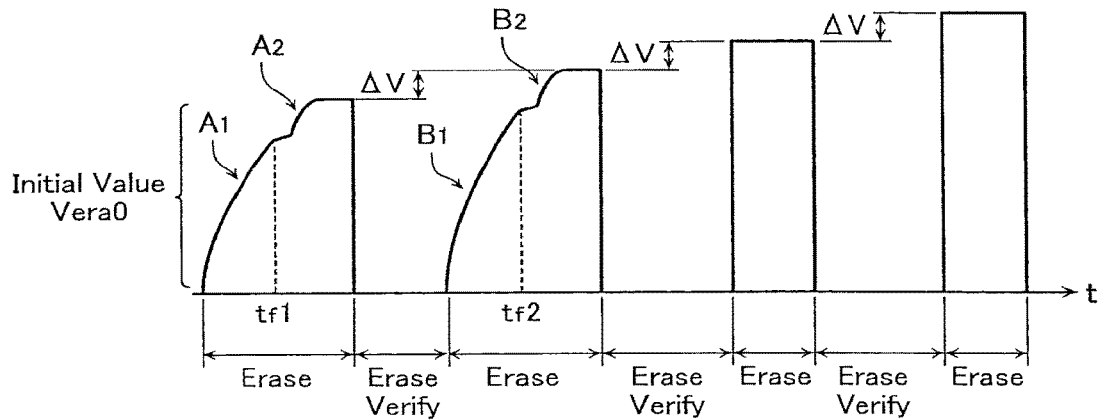
FIG. 10
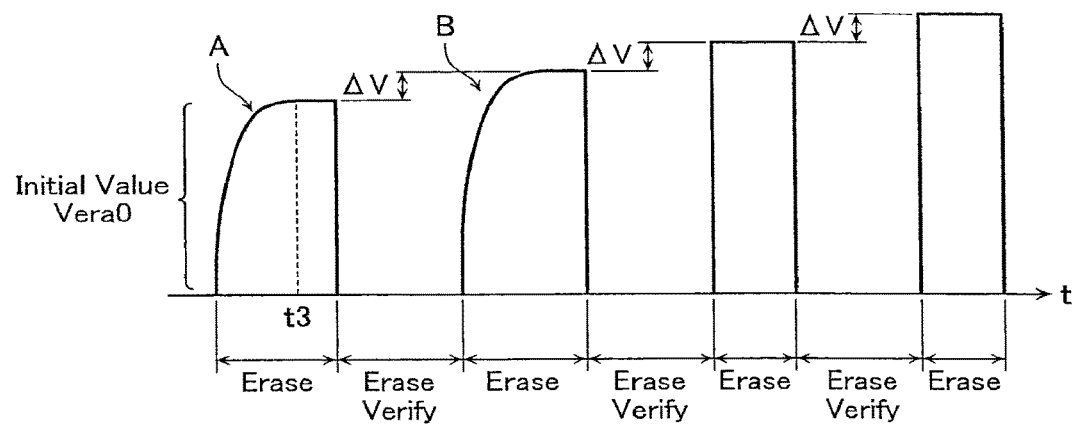
FIG. 11A
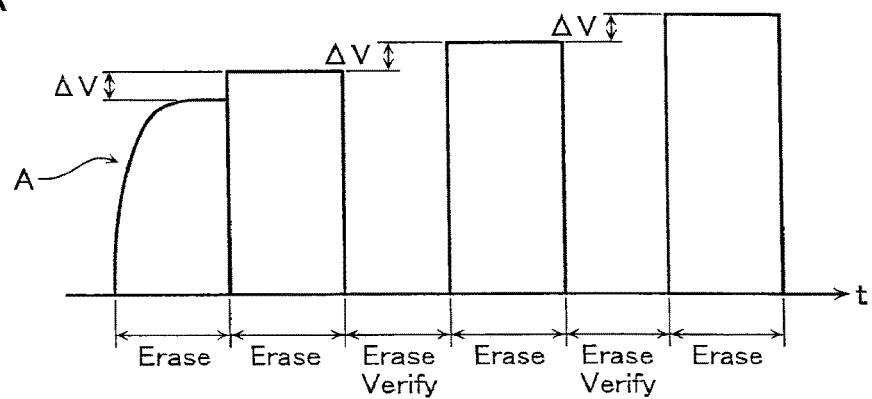

NON-VOLATILE SEMICONDUCTOR STORAGE DEVICE

CROSS REFERENCE TO RELATED APPLICATIONS

This application is a continuation of U.S. application Ser. No. 14/990,609 filed Jan. 7, 2016, which is a continuation of U.S. application Ser. No. 14/278,724 filed May 15, 2014, which is a continuation of U.S. application Ser. No. 13/941,931 filed Jul. 15, 2013, which is a divisional of U.S. application Ser. No. 13/346,880 filed Jan. 10, 2012, which is a continuation of U.S. application Ser. No. 12/796,964 filed Jun. 9, 2010, and is based on and claims the benefit of priority from prior Japanese Patent Application No. 2009-167000, filed on Jul. 15, 2009, and prior Japanese Patent Application No. 2009-275695, filed on Dec. 3, 2009, the entire contents of each of which are incorporated herein by reference.

BACKGROUND OF THE INVENTION

Field of the Invention

The present invention relates to an electrically erasable and programmable non-volatile semiconductor storage device.

Description of the Related Art

NAND-type flash memory has a cell array that includes a plurality of NAND cell units arranged therein, each of which has a plurality of memory cells connected in series. Each end of a NAND cell unit is connected to a bit line and a source line via selection gate transistors, respectively.

The control gates of memory cells in each NAND cell unit are connected to different word lines. In NAND-type flash memory, a plurality of memory cells are connected in series, sharing a source and a drain with each other. In addition, these memory cells share components, such as selection gate transistors or associated bit-line or source-line contacts. This may reduce the size of a unit memory cell. Furthermore, device regions including word lines and memory cells are generally arranged in a simple stripe pattern, which is suitable for shrinking and thus provides large capacity flash memory.

In addition, data program and erase are performed in NAND-type flash memory by causing FN tunnel current to flow through many cells at the same time. Specifically, data program is performed in pages, where a set of memory cells sharing one word line represent one or two pages. Data erasing is performed in blocks, where a block is defined as a set of NAND cell units sharing a word line and a selection gate line.

In addition, when data erase is performed in blocks in the NAND-type flash memory, verify read (erase verify) is performed to verify whether an erase state within a certain range of a threshold voltage is achieved (see, for example, Japanese Patent Laid-Open No. 2000-236031). As a result of the erase verify operation, if it is determined that the data erase is not sufficient, then additional erase and erase verify operations are iterated in a similar manner, increasing the erase voltage in stages (step up).

On the other hand, iterations of data program and erase on one memory cell can lead to progressive degradation of the tunnel insulation film of the memory cell, which may reduce the reliability of memory. Therefore, the stress on memory cells due to program and erase voltages should be reduced as much as possible. Reducing such stress on memory cells improves the reliability of memory and contributes to a longer lifetime of the memory cells.

SUMMARY OF THE INVENTION

One aspect of the present invention provides a non-volatile semiconductor storage device comprising: a memory cell array having an electrically erasable and programmable non-volatile memory cell arranged therein; and a control unit configured to control an erase operation to apply an erase pulse voltage to the memory cell for data erase, an erase verify operation to verify whether data erase is completed, and a step-up operation to increase the erase pulse voltage by a certain step-up voltage if data erase is not completed, the control unit controlling voltages so that at least a first erase pulse voltage initially generated in the erase operation has a longer rise time than that of a second erase pulse voltage generated subsequent to the first erase pulse voltage.

BRIEF DESCRIPTION OF THE DRAWINGS

FIG. 9B illustrates an operation of the NAND-type flash memory 21 according to the second embodiment of the present invention;

FIG. 10 illustrates an operation of NAND-type flash memory 21 according to a third embodiment of the present invention;

FIG. 11A illustrates an operation of NAND-type flash memory 21 according to a fourth embodiment of the present invention;

DETAILED DESCRIPTION OF THE EMBODIMENTS

Embodiments of the present invention will now be described in detail below with reference to the accompanying drawings.

First Embodiment

Figure 1:
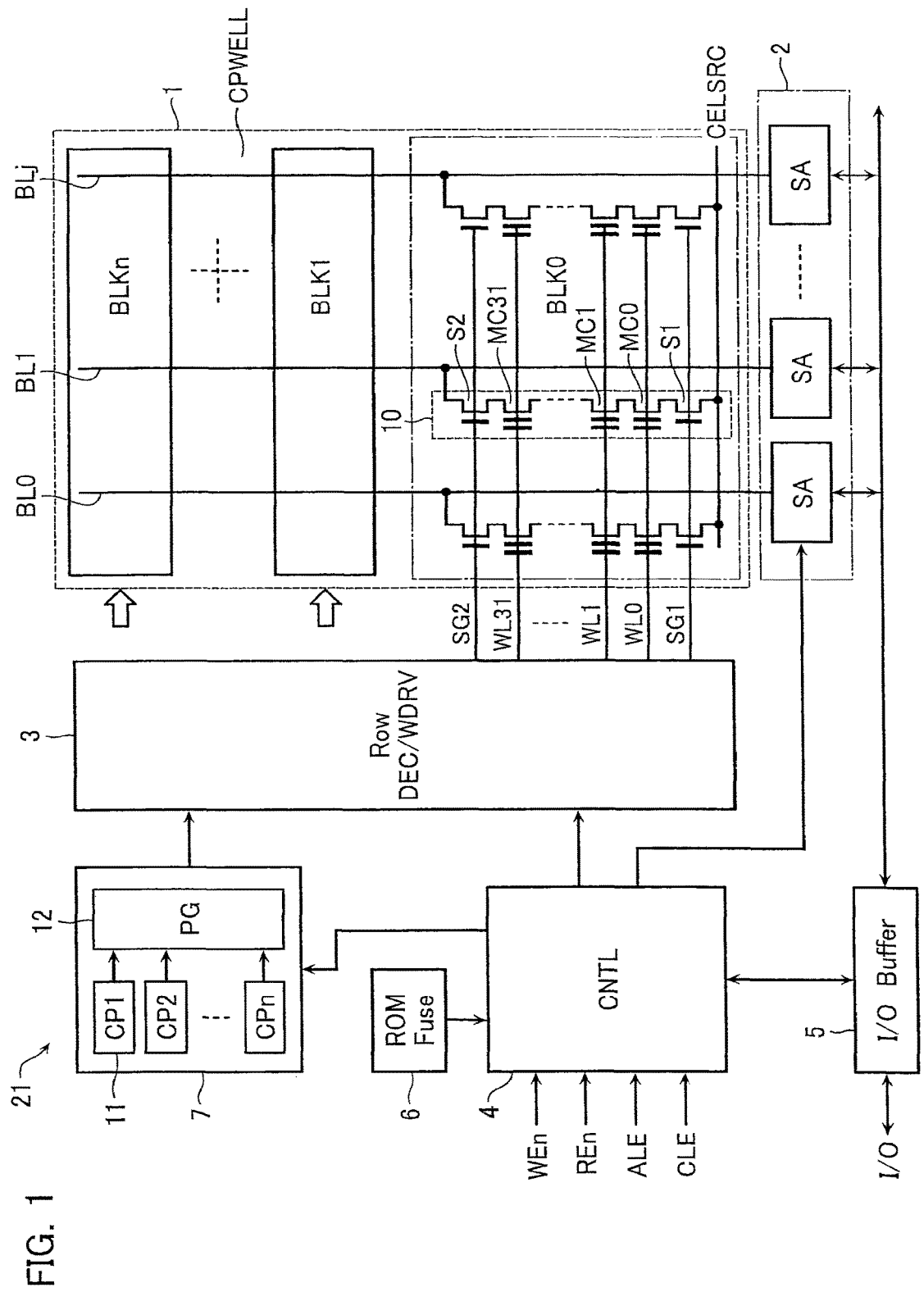
FIG. 1 schematically illustrates a configuration of NAND-type flash memory 21 according to a first embodiment of the present invention.

FIG. 1 schematically illustrates a configuration of NAND-type flash memory 21 according to a first embodiment of the present invention. As illustrated in FIG. 1, the NAND-type flash memory 21 includes a memory cell array 1, a sense amplifier circuit 2, a row decoder 3, a controller 4, an input/output buffer 5, a ROM fuse 6, and a voltage generation circuit 7. The controller 4 represents a control unit for the memory cell array 1.

The memory cell array 1 includes NAND cell units 10 arranged in a matrix form. One NAND cell unit 10 includes a plurality of memory cells MC (MC0, MC1, . . . , MC31) connected in series and selection gate transistors S1 and S2 connected to each end of thereof.

Although not illustrated, as well known in the art, one memory cell MC may be a cell that has a floating gate electrode as an electric charge accumulation layer on a gate insulation film (a tunnel insulation film) which is formed between the drain and the source. A control gate electrode is formed on the floating gate electrode via an intergate insulation film. The control gate is connected to one of word lines.

The selection gate transistors S1 have their sources connected to a common source line CELSRC, and the selection gate transistors S2 have their drains connected to bit lines BL.

The control gates of the memory cells MC in each NAND cell unit 10 are connected to different word lines WL (WL0, WL1, . . . , WL31), respectively. The gates of the selection gate transistors S1 and S2 are connected to selection gate lines SG1 and SG2 in parallel to the word lines WL, respectively. A set of multiple memory cells sharing one word line are included in one or two pages. A set of multiple NAND cell units 10 sharing the word lines WL, the selection gate lines SG1 and SG2 are included in a block BLK, which is a unit of data erase.

As illustrated in FIG. 1, a plurality of blocks BLK (BLK0, BLK1, . . . , BLKn) are included in the memory cell array 1 in the bit line BL direction. The memory cell array 1 including these multiple blocks is formed in one cellwell (CPWELL) of the silicon substrate.

The bit lines BL of the memory cell array 1 are connected to the sense amplifier circuit 2 that has a plurality of sense amplifiers SA including page buffers for sensing read data and storing data to be programmed to the memory cell. The sense amplifier circuit 2 has column selection gates. The row decoder (including a word-line driver) 3 selects and drives word lines WL and selection gate lines SG1, SG2.

The data input/output buffer 5 transmits and receives data between the sense amplifier circuit 2 and an external input/output terminal, and receives other data such as command data or address data. The controller 4 controls the entire memory operation in response to external control signals, such as program enable signals WEn, read enable signals REn, address latch enable signals ALE, or command latch enable signals CLE.

Specifically, the controller 4 includes a command interface as well as address latch and transfer circuits, and determines whether the supplied data is program data or address data. Depending on the results of this determination, program data is transferred to the sense amplifier circuit 2 or address data is transferred to the row decoder 3, the sense amplifier circuit 2, and so on.

The controller 4 also provides sequence control of read/program/erase, control of applied voltage, and so on, based on external control signals.

The voltage generation circuit 7 comprises a plurality of boost circuits 11 and a pulse generation circuit 12. The boost circuits 11 may include well-known charge pump circuits (charge pump circuits CP1, CP2, . . . , CPn). The voltage generation circuit 7 changes the number of driven boost circuits 11 based on control signals from the controller 4, and further controls the pulse generation circuit 12 to generate a desired pulse voltage. The number of driven boost circuits 11 is changed for the purpose of changing the rise time of the pulse voltage (the degree of waveform bluntness), which will be described later.

Figure 2:
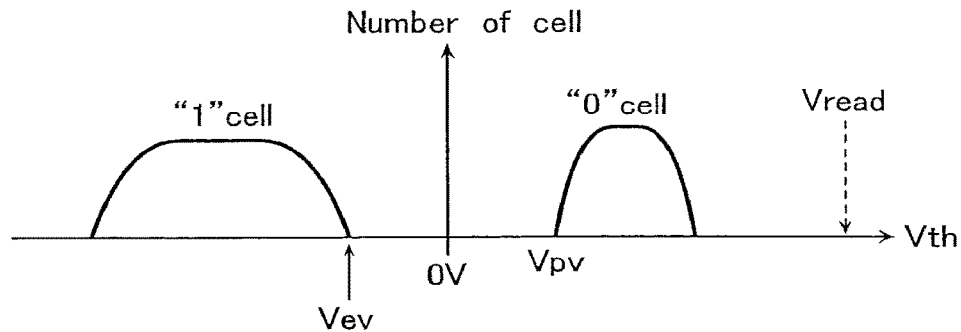
FIG. 2 illustrates a relation between data to be stored in a memory cell MC and threshold voltages.

FIG. 2 illustrates a relation between data to be stored in a memory cell MC and threshold voltages. For binary storage, a memory cell MC with a negative threshold voltage is defined as a "1" cell that retains logical "1" data, and with a positive threshold voltage as a "0" cell that retains logical "0" data. Consider that an operation for placing a memory cell into "1" data state is an erase operation, and an operation for placing a memory cell into "0" state is a program operation in a narrow sense. In NAND-type flash memory, data erase is normally performed in blocks.

[Erase Operation]

Figure 3:
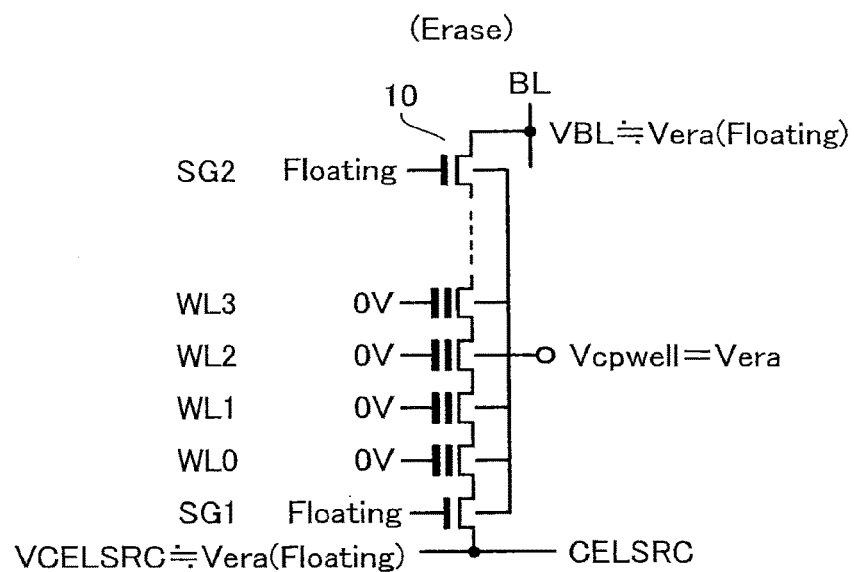
FIG. 3 illustrates a relation between potentials at the time of an erase operation, focusing on one NAND cell unit.

FIG. 3 illustrates a relation between potentials at the time of an erase operation, focusing on one of NAND cell units. The erase operation is performed in blocks. An erase pulse voltage Vera (on the order of 10V to 30V) is applied to the cellwell (CPWELL), and 0V is applied to all of the word lines WL in a selected block. As a result, electrons are extracted from the floating gates of respective memory cells to the cellwell using FN tunnel current to reduce the threshold voltages of the memory cells. At this point, the selection gate lines SG1 and SG2 are set into floating states to avoid breakdown of the gate oxide films of the selection gate transistors S1 and S2.

The bit line BL and the source line CELSRC are also set into floating states. As described below, the erase pulse voltage Vera is stepped up by a voltage $\Delta V$ according to the results of an erase verify operation after an erase operation. Using the stepped-up voltage Vera+$\Delta V$, an erase operation is performed again. It is also assumed that at least the initially provided erase pulse voltage Vera0 has a longer rise time than that of the subsequently provided erase pulse voltage Vera, as it were, having a blunted waveform.

[Program Operation]

A program operation is performed in pages. During a program operation, a program pulse voltage Vpgm (about 10 V to 25V) is applied to a selected word line in a selected block, a program intermediate voltage Vpass (about 5V to 15V) is applied to unselected word lines, and Vdd is applied to the selection gate line SG2.

Prior to this program operation, the bit line and the NAND cell unit are precharged according to the program data. Specifically, in programming "0" data, 0V is applied to the bit line by the sense amplifier circuit 2. This voltage of the bit line is transferred to the channel of the memory cell that is connected to a selected word line via the selection gate transistor S2 and unselected memory cells. As such, under the above-mentioned program operation conditions, electrons are injected into the floating gate from the channel of the selected memory cell, and the threshold voltage of the memory cell shifts to positive (which provides a "0" cell).

In programming "1" (i.e., in case "0" data is not programmed to the selected memory cell; program inhibit), Vdd is applied to the bit line. This voltage of the bit line is reduced by the threshold voltage of the selection gate transistor S2 and then transferred to the channel of the NAND cell unit, by which the channel is set into a floating state. Thus, electrons are not injected into the floating gate as the channel voltage increases due to the capacitive coupling when a voltage is applied, such as a program pulse voltage Vpgm or intermediate voltage Vpass as mentioned above. Accordingly, the memory cell retains "1" data.

[Read Operation]

In data read, a read voltage 0V is provided to a word line (selected word line) to which a selected memory cell in the NAND cell unit 10 is connected, while a read voltage (on the order of 3V to 8V) is applied to the other word lines (unselected word lines) to which unselected memory cells are connected. At this point, the sense amplifier circuit 2 detects whether or not current flows through the NAND cell unit 10 to determine what data is stored therein.

[Erase Verify Operation]

In reading data, a sufficient margin is required between a set threshold state and a read voltage for ensuring data reliability. Therefore, as illustrated in FIG. 3, a lower limit value Vpv of the threshold of "0" data and an upper limit value Vev of the threshold of "1" data is controlled both in data erase and program operations.

Thus, in a data erase, after an erase voltage Vera is applied as a pulse voltage in the erase operation as mentioned above, a verify read operation (an erase verify read operation) is performed to verify that the threshold voltage of the erase cell is not more than the upper limit value Vev. In the program operation, after a program pulse is applied by the operation as mentioned above, verify read (write verify) is performed to verify that the threshold voltage of the cell which is programmed with "0" is not less than the lower limit value Vpv within the threshold voltage distribution.

Figure 4:
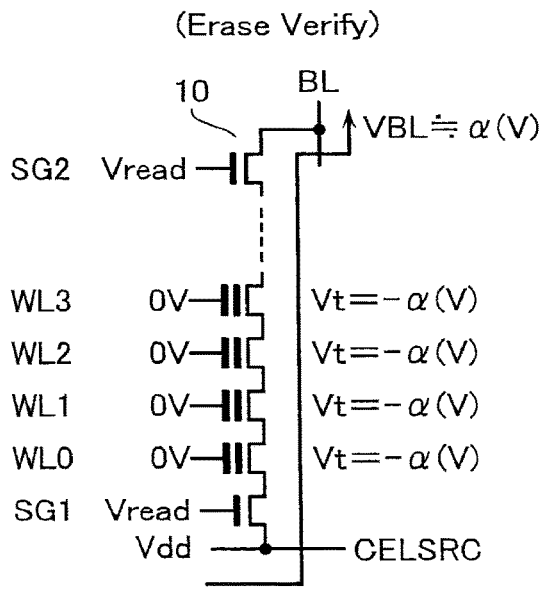
FIG. 4 illustrates voltages applied to a NAND cell unit 10 at the time of an erase verify read operation.

FIG. 4 illustrates voltages applied to the NAND cell unit 10 at the time of an erase verify read operation. A power supply voltage Vdd is applied to the cell source line CELSRC, 0V is applied to all of the word lines in a selected block, and an intermediate voltage Vread (about 3.0 to 4.5V) which is higher than the power supply voltage Vdd is applied to the selection gate lines SG1 and SG2. The bit line BL is precharged to 0V. If all of the memory cells in the NAND cell unit are erased to a "1" state in the threshold voltage Vth=−αV≤Vev (where α is a positive value), then a voltage on the order of αV, which represents an absolute value of the threshold voltage Vth for the memory cells, is output to the bit line through the above-mentioned verify read. That is, in order to have −αV as the upper limit value Vev of the threshold of "1" data illustrated in FIG. 3, the sense amplifier circuit 2 only needs to detect that the bit line voltage is not less than αV. If the sense amplifier circuit 2 detects that the bit line voltage is not less than αV, then it is considered that all of the memory cells in the NAND cell unit are sufficiently erased, in which case the erase operation terminates. If the bit line voltage is less than αV, then it is indicated that there is an insufficiently erased cell, in which case an erase operation is performed again.

[Step-Up Operation]

Figure 5:
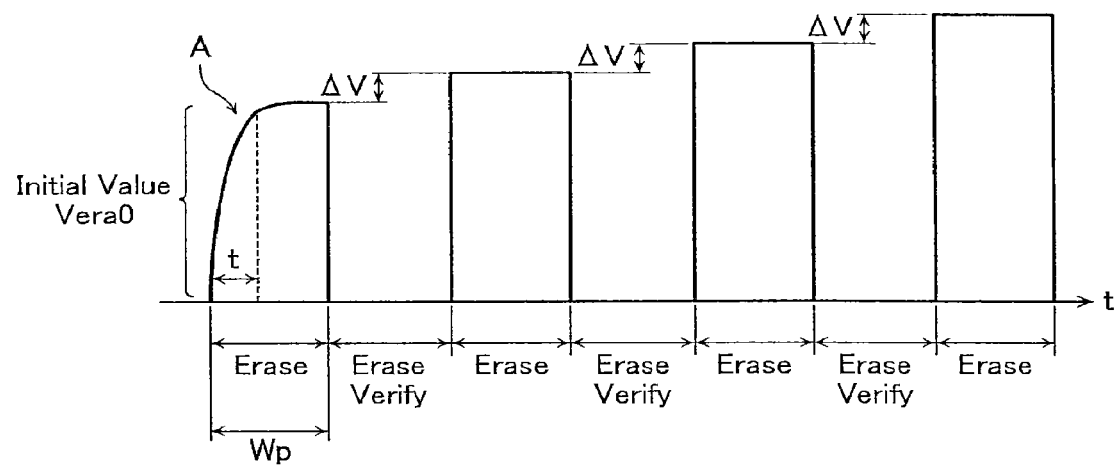
FIG. 5 illustrates how an erase voltage Vera steps up when an erase operation is performed again after an erase verify operation.

When an erase operation is performed again, the erase voltage Vera is set to a voltage (Vera0+ΔV) which is larger than an initial value Vera0 by a step-up value ΔV (>0) (see FIG. 5). If there still remains any cell that is not sufficiently erased even by the reset large erase voltage Vera=Vera0+ΔV, then another step-up operation is performed to increase the erase voltage by a step-up value ΔV (set Vera=Vera0+2ΔV). The erase, erase verify, and step-up operations are iterated until the data erase is completed (the erase voltage Vera steps up by ΔV for each iteration). Note that the step-up width may be of any value that is larger than the previous erase voltage, not limited to equal values of ΔV.

[Control of Rise Time of Erase Pulse Voltage]

Figure 6A:
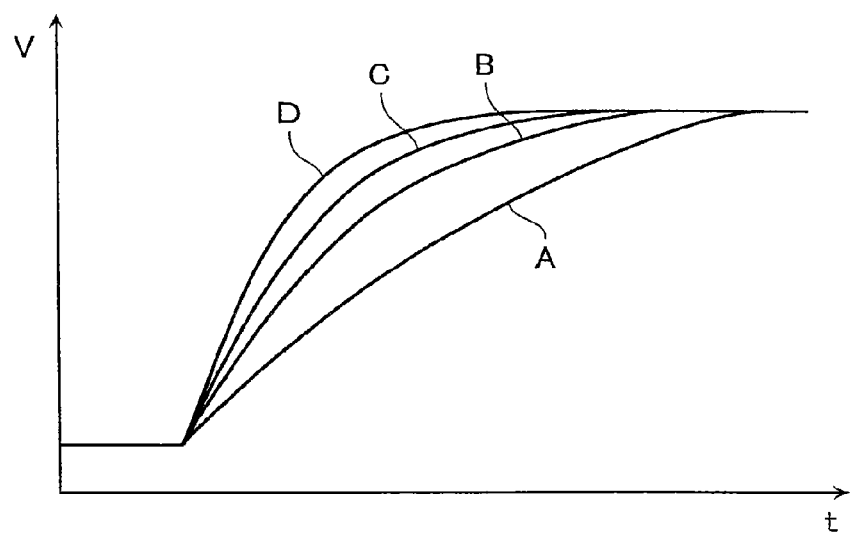
FIG. 6A is a graph illustrating the change of the rise time of the erase pulse voltage Vera (the gradient of the voltage change curve) as the number of driven boost circuits 11 is changed at a voltage generation circuit 7.

As described above, the erase pulse voltage Vera is stepped up by a voltage ΔV according to the results of the erase verify operation. It is also assumed that, as illustrated in FIG. 5, at least the initially provided erase pulse voltage Vera0 has a longer rise time than that of the subsequently provided erase pulse voltage Vera, as it were, having a blunted waveform (as indicated by arrow A of FIG. 5). As described above, the voltage generation circuit 7 has a plurality of boost circuits 11. The rise time of the boost pulse voltage Vera (the gradient of the voltage change curve) can be changed by increasing the number of driven boost circuits 11 in a progressive manner such as, e.g., indicated by A to D in FIG. 6A. Thus, for example, a large number of (e.g., L) boost circuits 11 are driven in normal times so that the waveform D is obtained. On the other hand, as compared with the waveform D, a smaller number of (e.g., M (N≥L>M)) boost circuits 11 are driven in applying the initially provided erase pulse voltage Vera0 so that the waveform A is obtained. This may provide the erase pulse voltage Vera0 with a waveform having a blunt rising edge, which reduces the stress on the tunnel insulation films of memory cells. This reduction in stress will be described referring to FIGS. 7 and 8.

Figure 7:
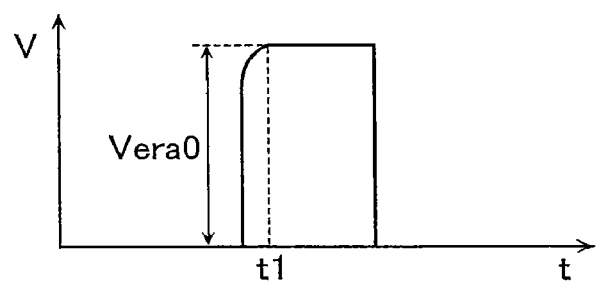
FIG. 7 is a typical diagram for describing advantages of this embodiment.
Figure 7:
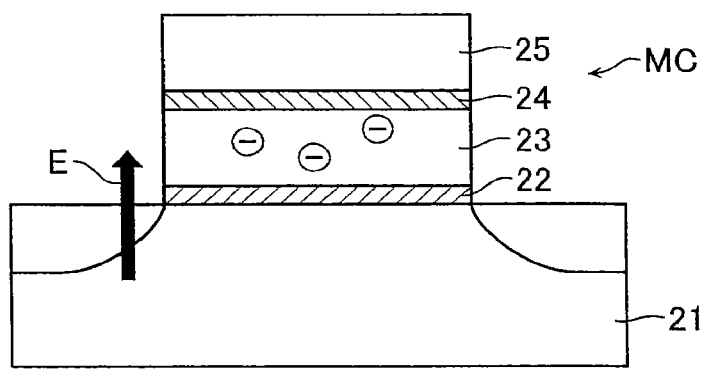
Figure 8:
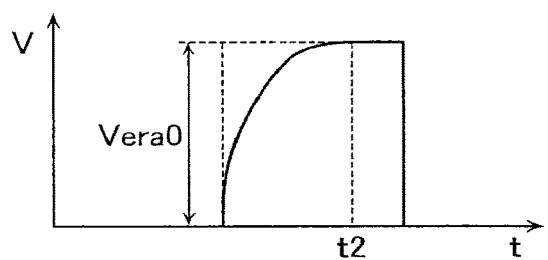
FIG. 8 is a typical diagram for describing advantages of this embodiment.
Figure 8:
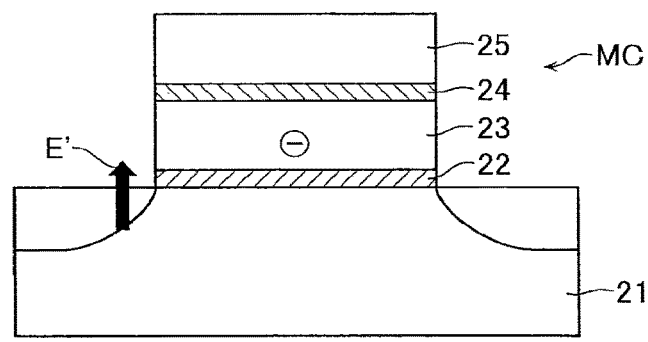

FIGS. 7 and 8 each typically illustrate a difference between effects on a memory cell MC for different rise times (different slopes of the voltage change curve) of the erase pulse voltage Vera0 which is initially applied in an erase operation. FIGS. 7 and 8 are typical cross-sectional views of a memory cell MC, where labels 21 to 25 represent a well, a tunnel insulation film, a floating gate electrode, an integrate insulation film, and a control gate electrode, respectively.

As illustrated in FIG. 7, if the voltage rises to the voltage value Vera0 in an extremely short time, most of the electrons that are accumulated in the floating gate electrode 23 will not be discharged therefrom but remain therein at time t1 when the voltage value Vera0 is reached. Due to the many remaining electrons, a large electric field is produced at the tunnel insulation film 22. In contrast, as illustrated in FIG. 8, if the voltage rises to the voltage value Vera0 in a longer time, the accumulated electric charges in the floating gate electrode 23 are progressively discharged even in the process of rising, and will be mostly discharged at time t2 when the voltage value Vera0 is reached. Accordingly, the electric field produced at the tunnel insulation film 22 may be small as compared with the case of FIG. 7.

As such, in this embodiment, the erase pulse voltage Vera0 which is initially applied in an erase operation has a longer rise time than that of the subsequently applied erase pulse voltage Vera. If an erase pulse voltage Vera with a shorter rise time is used during an early stage of the erase operation when many electric charges are still accumulated in the floating gate electrode 23, a larger stress is exerted on the tunnel insulation films 22 of memory cells MC, accelerating degradation of the memory cells MC. Such degraded memory cells MC involve a larger percentage of memory cells MC that are susceptible to be changed from data "1" to "0" (easily programmed with "0"), increasing the probability of incorrect program operation. The stress on the tunnel insulation films 22 of memory cells MC may be reduced using an erase pulse voltage with a longer rise time and a blunted waveform as illustrated in FIG. 8.

As illustrated in FIG. 5, a relation of Wp/3≤t may be satisfied in terms of reducing stress of the tunnel insulation films 22, where Wp is a pulse width of the initially applied erase pulse voltage Vera0, and t is a width of the rise curve of the erase pulse voltage Vera0. The rise curve ends at a certain value (saturation value: a value at a substantially flat area which is higher than the inflection point in the rise curve, with a disturbance such as a noise being excluded). In this case, the part of width t in the rise curve may be followed by a constant or progressively increased (to a saturation state) voltage. Particularly, applying an erase pulse satisfying the above expression may lower the upper limit of the threshold distribution of a "1" cell after iterations of program/erase. That is, this can prevent incorrect program from changing a "1" cell to a "0" cell.

Figure 6B:
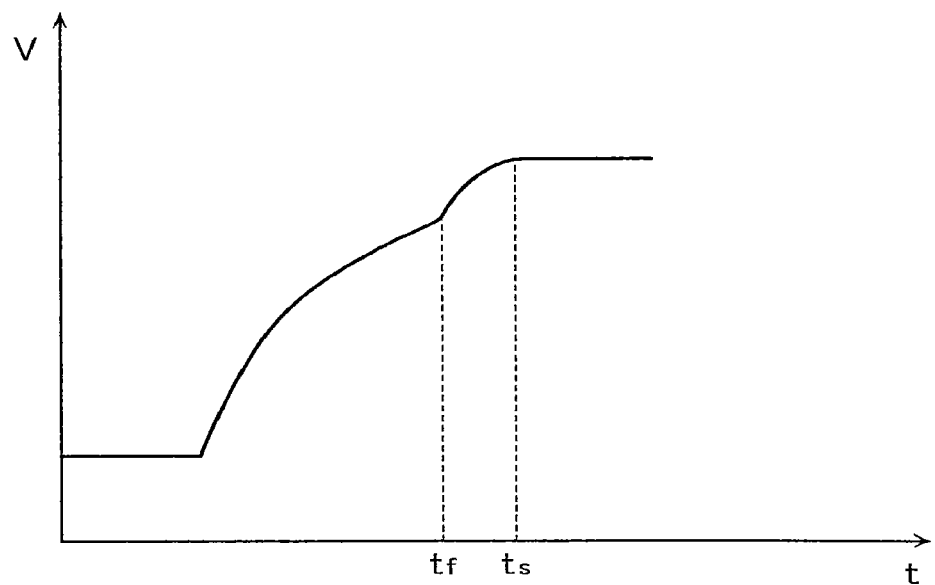
FIG. 6B is a graph illustrating the change in gradient of one erase pulse voltage Vera.

In addition, as illustrated in FIG. 6B, the rising edge of the erase pulse voltage may also be controlled so that it rises with a first bluntness (a first gradient) until time tf, and then with a second bluntness steeper than the first bluntness (a second gradient larger than the first gradient) until time ts. Since NAND-type flash memory needs to generate a plurality of voltages, such as program or intermediate voltages, at the same time, it may have separate voltage generation circuits 7 for the individual voltages.

In this case, a first bluntness may be formed at a first voltage generation circuit, and a second bluntness steeper than the first bluntness may be formed using a second voltage generation circuit in addition to the first voltage generation circuit, so that the erase pulse voltage rises with the first and second bluntnesses. Consequently, during an early stage of the erase operation when many electric charges are still accumulated in the floating gate electrode 23, the erase time may be reduced by providing a sharper rise after time tf by which the accumulated electric charges in the floating gate electrode 23 are discharged to some extent, while mitigating the stress on the tunnel insulation film 22 of a memory cell MC.

Furthermore, a second bluntness may be easily generated by a combination of a plurality of voltage generation circuits.

However, if the accumulated electrons are mostly discharged from the floating gate electrode 23 by the initially applied erase pulse voltage Vera0, it is rather preferable that a normal erase pulse voltage with a shorter rise time is used in the subsequent erase operation (voltage Vera0+n*ΔV) (see FIG. 5). That is, the voltage generation circuit 7 may drive all the boost circuits 11 to generate an erase pulse voltage. This is because the electric field produced at the tunnel insulation film 22 cannot become stronger even if a normal erase pulse voltage with a shorter rise time is used as long as the accumulated electrons are mostly discharged at the time, causing no significant stress on the tunnel insulation film 22. Rather, using an erase pulse voltage with a shorter rise time leads to a reduced erase time.

Note that how many of the boost circuits 11 to be driven when applying the first erase pulse voltage Vera0 in an erase operation may be stored as voltage setting data in, e.g., the ROM fuse 6 of FIG. 1. According to this voltage setting data, the controller 6 may determine the number of boost circuits 11 to be driven.

Second Embodiment

Figure 9A:
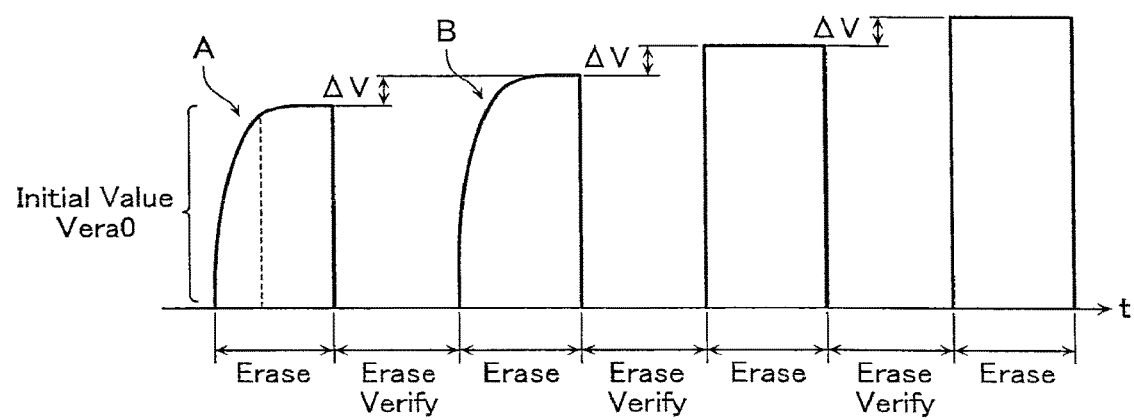
FIG. 9A illustrates an operation of NAND-type flash memory 21 according to a second embodiment of the present invention.

Referring now to FIG. 9A, a second embodiment of the present invention will be described below. This embodiment is different from the first embodiment in that a blunted waveform is used not only when the first erase pulse voltage Vera0 is applied, but also when the second erase pulse voltage Vera0+ΔV is applied (label B of FIG. 9A). Thus, the stress on the tunnel insulation films of memory cells MC can be reduced even more by increasing the number of erase pulse voltages having a blunted waveform. While FIG. 9A illustrates a case where the number of erase pulse voltages having a blunted waveform is two, the present invention is not so limited and may include a larger number of erase pulse voltages Vera having a blunted waveform. This number may be specified according to the control data stored in the ROM fuse 6 as described above. Alternatively, the controller 4 may store data, such as the number of program/erase times on a specific block BLK, the number of loops (step-ups) in a program operation, or the number of loops (step-ups) in an erase operation. Based on the data, the controller 4 may control the number of erase pulse voltages Vera having a blunted waveform, as appropriate.

In addition, different numbers of boost circuits 11 may be driven for the first erase pulse voltage Vera0 and the second erase pulse voltage Vera0+ΔV (e.g., two for the former, four for the latter).

As illustrated in FIG. 9B, the first and second erase pulse voltages may also have waveforms such as illustrated in FIG. 6B. That is, the voltage generation circuit may be controlled to provide one erase pulse voltage with two different bluntnesses (A1 and A2, or B1 and B2). In FIG. 9B, the first erase pulse voltage has a first bluntness A1 at the beginning, and then another bluntness A2 steeper than the first bluntness A1 after time tf1. Similarly, the second erase pulse voltage has a first bluntness B1 at the beginning, and then another bluntness B2 steeper than the first bluntness B1 after time tf2. In this case, the first erase pulse voltage may have the first bluntness A1 gentler than the first bluntness B1 of the second erase pulse voltage.

In this case, the first bluntness A1 of the first erase pulse voltage may be generated by driving M (M<N) of the boost circuits in the first voltage generation circuit, while the first bluntness B1 of the second erase pulse voltage being generated by driving L (N≥L>M) of the boost circuits in the first voltage generation circuit. Consequently, during an early stage of the erase operation when many electric charges are still accumulated in the floating gate electrode 23, the erase time may be reduced by providing a sharper rise after time tf by which the accumulated electric charges in the floating gate electrode 23 are discharged to some extent, while mitigating the stress on the tunnel insulation film 22 of a memory cell MC.

Furthermore, a second bluntness may be easily generated for the first and second erase pulse voltages by a combination of a plurality of voltage generation circuits.

Third Embodiment

Referring now to FIG. 10, a third embodiment of the present invention will be described below. This embodiment is different from the above-described embodiments in that an erase pulse voltage having a blunted waveform has a pulse width longer than that of a normal erase pulse voltage that does not have a blunted waveform in an erase operation.

In this case, while the erase pulse voltage of FIG. 10 has a blunted waveform from the rising edge, which is similar to the other embodiments described above, the voltage is saturated at time t3 and hence each part of a constant voltage value persists a longer period of time than those of the above embodiments. That is, a period after time t3 in which the voltage is saturated is set to be longer than those of the above-described embodiments. This longer period is determined in consideration of the bluntness of the waveform. This makes the pulse width thereof to be extended as a whole. As a result, an erase operation is performed at a high voltage for a certain period of time, which may facilitate the completion of the erase operation and mitigate the stress on the tunnel insulation film 22. The pulse width may be specified according to the control data stored in the ROM fuse 6 as described above. Alternatively, the controller 4 may store data, such as the number of program/erase times on a specific block BLK, the number of loops (step-ups) in a program operation, or the number of loops (step-ups) in an erase operation. Based on the data, the controller 4 may control the pulse width of the erase pulse voltage Vera having a blunted waveform, as appropriate.

Fourth Embodiment

Figure 11B:
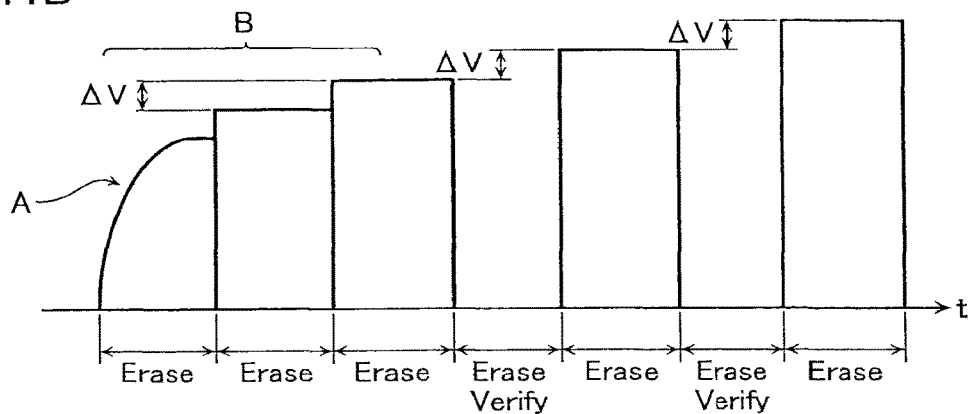
FIG. 11B illustrates an operation of NAND-type flash memory 21 according to a variation of the fourth embodiment of the present invention.

Referring now to FIG. 11A, a fourth embodiment of the present invention will be described below. This embodiment is different from the above-described embodiments in that it performs an erase operation using the first erase pulse voltage Vera0 having a blunted waveform, after which it directly transitions to the next erase operation using the stepped-up erase pulse voltage Vera0+$\Delta$V without performing an erase verify operation after the first erase operation. Since it is unlikely that the erase operation is completed with only the first erase pulse voltage Vera0, this embodiment attempts to reduce the erase time by omitting application of the subsequent erase verify voltage. In this case, the number of times subsequent erase operations are performed by stepped-up erase pulse voltages without erase verify operations may be specified according to the control data stored in the ROM fuse 6. For example, as illustrated in FIG. 11B, an erase pulse voltage may be applied more than once without an erase verify operation after application of the first erase pulse voltage Vera0. This operation may further reduce the time for the erase operation. It is also preferable to use a series of such erase pulses (label B of FIG. 11B) in terms of improved reliability of erase operation.

Figure 11C:
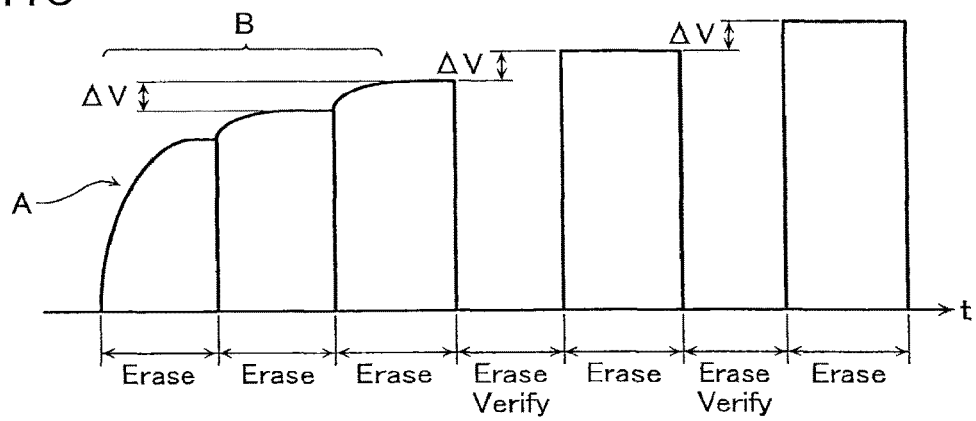
FIG. 11C illustrates an operation of NAND-type flash memory 21 according to a variation of the fourth embodiment of the present invention.

Furthermore, as shown in FIG. 11C as an example, after applying the initial erase pulse voltage Vera0, the erase pulse voltage may be applied the plural number of times while skipping an erase verify operation therebetween. In addition to this, a blunted waveform may be used for the second erase pulse voltage Vera0+$\Delta$V.

Fifth Embodiment

Figure 12:
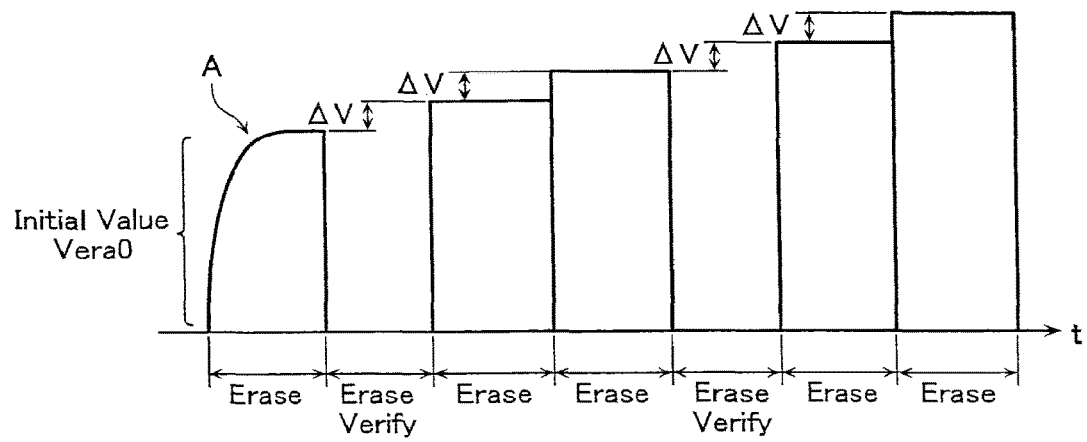
FIG. 12 illustrates an operation of NAND-type flash memory 21 according to a fifth embodiment of the present invention.

Referring now to FIG. 12, a fifth embodiment of the present invention will be described below. This embodiment is different from the above-described embodiments in that an erase verify operation is first performed after an erase operation using the first erase pulse voltage Vera0 having a blunted waveform, after which an erase verify operation is performed every other application of a normal erase pulse voltage Vera0+n*$\Delta$V. This may also reduce the erase time due to a reduced time for erase verify operation.

Sixth Embodiment

Figure 13:
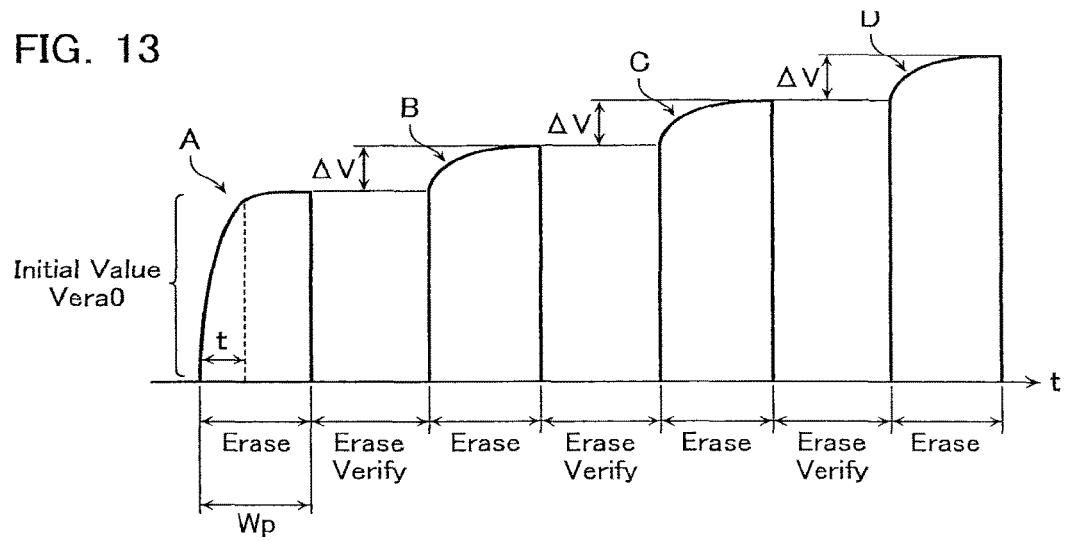
FIG. 13 illustrates an operation of NAND-type flash memory 21 according to a sixth embodiment of the present invention.

Referring now to FIG. 13, a sixth embodiment of the present invention will be described below. This embodiment is different from the first embodiment with respect to the following aspect described below. That is, in the sixth embodiment, there is provided a waveform having a partially blunted rising edge, rather than a rectangular pulse, not only when the first erase pulse voltage Vera0 is applied (label A of FIG. 13), but also when the second and subsequent erase pulse voltages Vera0+n$\Delta$V (n is an integer not less than 1) are applied (labels B to D of FIG. 13; which may hereinafter be referred to as "blunt-topped pulse waveforms"). However, at the second and subsequent erase pulse voltages Vera0+n$\Delta$V, each waveform has a blunt rising edge (gradient) after its voltage level rises to a point corresponding to a step-up value $\Delta$V (i.e., after it comes to a stage where a voltage is applied that has a voltage value exceeding that of the erase pulse voltage Vera0+(n−1)*$\Delta$V which is applied just before that voltage, where n is the number of erase pulses). In other words, the waveform is not blunted and has a large gradient as with a rectangular pulse before it reaches a point corresponding to a step-up value $\Delta$V.

For example, the second erase pulse voltage Vera0+$\Delta$V (label B) has a steep rising edge (without blunting) as with a rectangular pulse until its voltage level exceeds the voltage Vera0.

In contrast, the waveform B is blunted (i.e., it has a smaller gradient than the previous one) during a period of time between when it exceeds the voltage Vera0 and when it rises to Vera0+$\Delta$V. This is for the following reasons.

That is, a memory cell from which data is not erased by the first erase pulse voltage Vera0 (label A) is not likely to be erased even when it is applied with the second erase pulse voltage of Vera0+$\Delta$V in the next step, unless the voltage level thereof exceeds Vera0. This is because the memory cells MC could not be erased by the erase pulse at the erase pulse voltage of Vera0. Consequently, an erase pulse voltage Vera0+$\Delta$V larger than the erase pulse voltage Vera0 is applied at the second erase pulse.

However, applying the voltage at a voltage level above the voltage Vera0 may exert a relatively large stress on the tunnel insulation films of the memory cells. This stress is problematic, particularly when the tunnel insulation films are degraded after multiple iterations of program and erase operations. However, the accumulated electric charges in the floating gate electrodes of the memory cells MC are discharged to some extent due to application of the first erase pulse voltage Vera0. That is, at the second erase pulse, the voltage at a voltage level below the voltage Vera0 exerts a relatively small stress on the tunnel insulation films.

Accordingly, when applying the second erase pulse voltage Vera0+$\Delta$V, the waveform of the second erase pulse voltage is blunted after its voltage level exceeds the voltage Vera0 and then reaches a point corresponding to a step-up value $\Delta$V. This may effectively mitigate the stress on the tunnel insulation films. In this way, the range over which the waveform is blunted is limited to a point corresponding to a step-up value $\Delta$V. This may provide the second and subsequent erase pulse voltages with a smaller pulse width, reducing the time for the erase operation.

In addition, the blunt-topped pulse waveforms may be used only in case the characteristics of the tunnel insulation films are degraded. For example, erase pulses of rectangular shape are used for the second and subsequent erase pulse waveforms until the number of program/erase times exceeds a certain number of times, whereas blunt-topped pulse waveforms are used in case the number of program/erase times exceeds a certain number of times. As a result, fast erase operation may be achieved where the tunnel insulation films are less degraded, while the reliability of the memory cells may be improved where the tunnel insulation films are more degraded.

The certain number may also be specified according to the control data stored in the ROM fuse 6. Alternatively, the controller 4 may store data, such as the number of program/erase times on a specific block BLK, the number of loops (step-ups) in a program operation, or the number of loops (step-ups) in an erase operation. Based on the data, the controller 4 may control a blunt-topped pulse waveform to be used as the waveform of the second erase pulse.

As an example, the waveforms as indicated by labels B to D of FIG. 13 may be obtained by setting the number of operated charge pump circuits to n at the beginning of the rising edge of each waveform, and reducing it to n' (n'<n) afterward.

Figure 14:
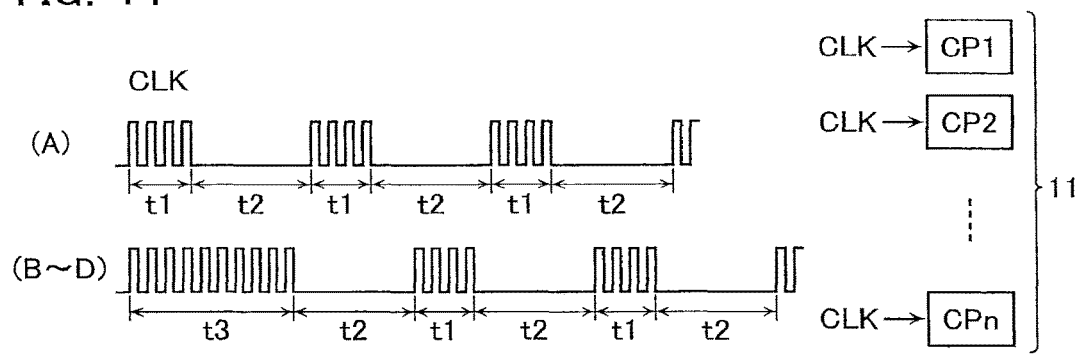
FIG. 14 schematically illustrates one of methods of generating voltages according to the sixth embodiment of the present invention.

Alternatively, these waveforms B to D may also be obtained by changing the waveforms of the clock pulses CLK provided to the charge pump circuits, as illustrated in FIG. 14. Firstly, to obtain the waveform A, clock pulses CLK are continuously generated at period t1 for operating the charge pump circuits to continue the boost operation, and then the clock pulses CLK are terminated at period t2. Then, periods t1 and t2 may be repeated from the beginning of the rising edge of the waveform until the voltage value Vera0 is obtained. As a result, a blunted waveform as the waveform A may be generated.

On the other hand, to obtain the waveforms B to D, clock pulses CLK are continuously generated to cause a steep rise in voltage at period t3 (t3>>t1) before the voltage level reaches the voltage Vera+(n−1)*ΔV prior to step-up. However, once the voltage level reaches the voltage Vera+(n−1)*ΔV prior to step-up, periods t1 and t2 are repeated from then on as in the waveform A.

That is, it is possible to generate a blunted waveform such as the waveform A, or the part of ΔV in the waveform B and others, without reducing the number of charge pump circuits. Therefore, it is possible to prevent the waveforms from being affected by variations in the characteristics of those transistors included in respective charge pump circuits, or in the characteristics of those transistors to cut off the voltage supplied by charge pumps. As a result, improved control of the waveforms A to D may be achieved and more stable waveforms may be obtained.

Figure 15:
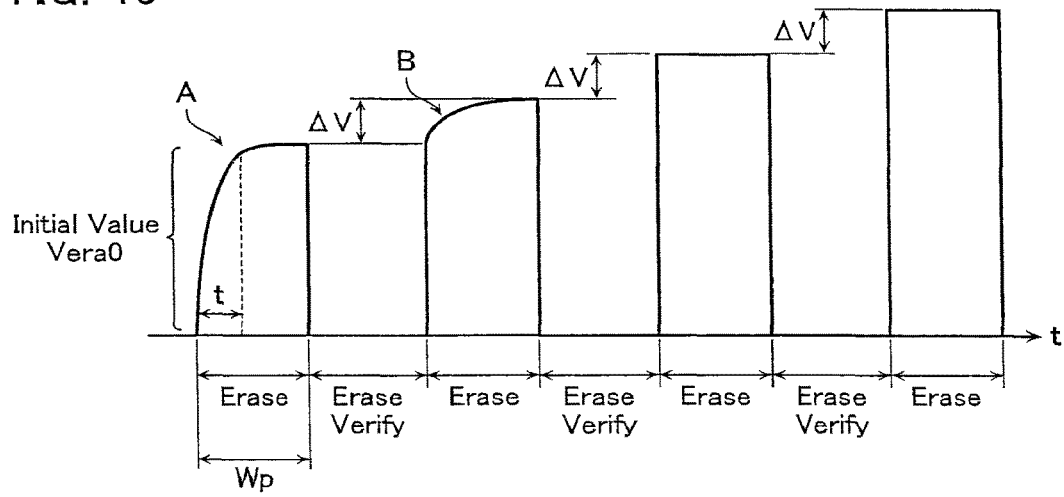
FIG. 15 illustrates an operation of a variation of the sixth embodiment of the present invention.

Note that while all the waveforms A to D are blunted in FIG. 13, it is also possible that only the waveforms A and B are blunted and the waveforms C and D are rectangular waves, as with the case with FIG. 15.

Others

While embodiments of the present invention have been described, the present invention is not intended to be limited to the disclosed embodiments, and various other changes, additions or the like may be made thereto without departing from the spirit of the invention. In addition, combinations of any of the above embodiments may also be implemented. Furthermore, the method of generating waveforms as illustrated in FIG. 14 is also applicable to the first to fifth embodiments.

What is claimed is:

1. A non-volatile semiconductor storage device comprising:
   a memory cell array including an electrically rewritable non-volatile memory cell arranged therein; and
   a control unit configured to perform controlling of repeating an erase operation to apply an erase pulse voltage to the memory cell for data erase and an erase verify operation to verify whether data erase is completed, and to cause the erase pulse voltage to increase by a certain step-up voltage in the erase operation performed again in the repeating of the erase operation and the erase verify operation after it is verified that data erase is not completed in the erase verify operation,
   the control unit being configured to, in the erase operations alternately repeated with the erase verify operation, perform a first erase operation as an initial one of the erase operations and, subsequent to the first erase operation, a second erase operation as a next one of the erase operations, the erase verify operation being performed between the first erase operation and the second erase operation, and
   the control unit being configured to control the erase pulse voltage such that:
   at least a first erase pulse voltage of the erase pulse voltage has a blunted wave-shape portion, the first erase pulse voltage being applied to the memory cell in the first erase operation,
   the blunted wave-shape portion of the first erase pulse voltage includes a continuous curve satisfying a relation of $Wp/3 \leq t$, wherein Wp is a pulse width of the first erase pulse voltage, and t is a width of the continuous curve of the first erase pulse voltage; and
   a second erase pulse voltage has a voltage value at a saturation state larger than that of the first erase pulse voltage, the second erase pulse voltage being applied to the memory cell in the second erase operation.

2. The non-volatile semiconductor storage device according to claim 1, wherein
   the control unit controls a voltage of the first erase pulse voltage such that a voltage wave shape of the first erase pulse voltage when a vertical axis thereof denotes a voltage and a lateral axis denotes time has a gradient such that a gradient at a first point of time is not larger than a gradient at a second point of time before the first point of time through the continuous curve, the blunted wave-shape portion of the first erase pulse voltage being included in rising of the first erase pulse voltage and being continuous to the voltage value at the saturation state of the first erase pulse voltage.

3. The non-volatile semiconductor storage device according to claim 1, wherein
   the control unit is configured to, in the erase operations alternately repeated with the erase verify operation, further perform a third erase operation as one of the erase operations subsequent to the second erase operation, the erase verify operation being performed between the second erase operation and the third erase operation, and
   the control unit is configured to control the erase pulse voltage such that:
   in the first erase operation, the first erase pulse voltage reaches a first saturation value,
   in the second erase operation, the second erase pulse voltage reaches a second saturation value, in the third erase operation, a third erase pulse voltage applied to the memory cell reaches a third saturation value, the erase pulse voltage is increased by the certain step-up voltage from the first saturation value to the second saturation value, and from the second saturation value to the third saturation value, a difference between the first saturation value and the second saturation value and a difference between the second saturation value and the third saturation value being equal to each other, and a width of the blunted wave-shape portion that is continuous to the voltage value at the saturation state is set such that the first erase pulse voltage is longer than the second erase pulse voltage with respect to the width of the blunted wave-shape portion.

4. The non-volatile semiconductor storage device according to claim 1, wherein the control unit is configured to, in the erase operations alternately repeated with the erase verify operation, further perform a third erase operation as one of the erase operations subsequent to the second erase operation, the erase verify operation being performed between the second erase operation and the third erase operation, and the control unit is configured to control the erase pulse voltage such that:

in the first erase operation, the first erase pulse voltage reaches a first saturation value, in the second erase operation, the second erase pulse voltage reaches a second saturation value, in the third erase operation, a third erase pulse voltage applied to the memory cell reaches a third saturation value, the erase pulse voltage is increased by the certain step-up voltage from the first saturation value to the second saturation value, and from the second saturation value to the third saturation value, a difference between the first saturation value and the second saturation value and a difference between the second saturation value and the third saturation value being equal to each other, and a width of the blunted wave-shape portion that is continuous to the voltage value at the saturation state is set such that the first erase pulse voltage is longer than the third erase pulse voltage with respect to the width of the blunted wave-shape portion.

5. The non-volatile semiconductor storage device according to claim 4, wherein the control unit is configured to control the erase pulse voltage such that the pulse width of the first erase pulse voltage is longer than that of the third erase pulse voltage.

6. The non-volatile semiconductor storage device according to claim 1, wherein the control unit controls a voltage of the first erase pulse voltage such that the continuous curve thereof is followed by a substantially flat area, the substantially flat area having the voltage value at the saturation state of the first erase pulse voltage.

7. The non-volatile semiconductor storage device according to claim 6, wherein the control unit controls a voltage of the first erase pulse voltage such that the voltage is progressively increased following the continuous curve until the voltage reaches the saturation state.

8. The non-volatile semiconductor storage device according to claim 6, wherein the control unit controls a voltage of the first erase pulse voltage such that the voltage is set constant following the continuous curve at the saturation state.

9. The non-volatile semiconductor storage device according to claim 1, wherein the control unit controls a voltage of the second erase pulse voltage such that a voltage wave shape of the second erase pulse voltage when a vertical axis thereof denotes a voltage and a lateral axis denotes time has a continuous curve in which a gradient at a first point of time is not larger than a gradient at a second point of time before the first point of time through the continuous curve, the blunted wave-shape portion of the second erase pulse voltage including the continuous curve and being continuous to the voltage value at the saturation state of the second erase pulse voltage.

10. The non-volatile semiconductor storage device according to claim 1, wherein the control unit is configured to control the erase pulse voltage such that the first erase pulse voltage is longer than the second erase pulse voltage with respect to a width of the blunted wave-shape portion thereof.

11. A non-volatile semiconductor storage device comprising: a memory cell array including an electrically rewritable non-volatile memory cell arranged therein; and a control unit configured to perform controlling of repeating an erase operation to apply an erase pulse voltage to the memory cell for data erase and an erase verify operation to verify whether data erase is completed, and to cause the erase pulse voltage to increase by a certain step-up voltage in the erase operation performed again in the repeating, of the erase operation and the erase verify operation after it is verified that data erase is not completed in the erase verify operation, the control unit being configured to, in the erase operations alternately repeated with the erase verify operation, perform a first erase operation as an initial one of the erase operations and, subsequent to the first erase operation, a second erase operation as a next one of the erase operations, the erase verify operation being performed between the first erase operation and the second erase operation, and the control unit being configured to control a first erase pulse voltage applied to the memory cell in the first erase operation and a second erase pulse voltage applied to the memory cell in the second erase operation such that:

at least a voltage wave shape of the first erase pulse voltage when a vertical axis thereof denotes a voltage and a lateral axis denotes time has a blunted wave-shape portion that k continuous to a saturation value thereof, the blunted wave-shape portion being defined by a period in which a gradient at a first point of time is not larger than a gradient at a second point of time before the first point of time in the voltage wave shape through the period; and the first erase pulse voltage is longer than the second erase pulse voltage with respect to a width of the blunted wave-shape portion, wherein relation of $Wp/3 \leq t$ is satisfied, wherein $Wp$ is a pulse width of the first erase pulse voltage, and $t$ is the width of the blunted wave-shape portion of the first erase pulse voltage.

12. The non-volatile semiconductor storage device according to claim 11, further comprising:

a voltage generation circuit including N (N≥2) boost circuits, each configured to generate a boosted voltage based on a power supply voltage, and a pulse generation circuit configured to generate the erase pulse voltage using the boosted voltage, wherein the control unit drives M (M<N) of the boost circuits when generating the first erase pulse voltage, and drives L (N≥L>M) of the boost circuits when generating the second erase pulse voltage.

13. The non-volatile semiconductor storage device according to claim 10, wherein the control unit is configured to, in the erase operations alternately repeated with the erase verify operation, further perform a third erase operation as one of the erase operations subsequent to the second erase operation, the erase verify operation being performed between the second erase operation and the third erase operation, and the control unit is configured to control the erase pulse voltage such that:

in the first erase operation, the first erase pulse voltage reaches a first saturation value, in the second erase operation, the second erase pulse voltage reaches a second saturation value, in the third erase operation, a third erase pulse voltage applied to the memory cell reaches a third saturation value, the erase pulse voltage is increased by the certain step-up voltage from the first saturation value to the second saturation value, and from the second saturation value to the third saturation value, a difference between the first saturation value and the second saturation value and a difference between the second saturation value and the third saturation value being equal to each other, and the width of the blunted wave-shape portion that is continuous to the first saturation value in the first erase pulse voltage is set such that the first erase pulse voltage is longer than the second erase pulse voltage and than the third erase pulse voltage with respect to the width of the blunted wave-shape portion.

14. The non-volatile semiconductor storage device according to claim 11, wherein the control unit controls a voltage of the first erase pulse voltage such that a rise curve thereof is followed by a substantially flat area, the blunted wave-shape portion including the rise curve, and the substantially flat area having the saturation value of the first erase pulse voltage.

15. The non-volatile semiconductor storage device according to claim 14, wherein the control unit controls a voltage of the first erase pulse voltage such that the rise curve is followed by a constant voltage having the saturation value or a progressively increased voltage reaching the saturation value.

16. The non-volatile semiconductor storage device according to claim 11, wherein the control unit controls a voltage of the second erase pulse voltage such that a voltage wave shape of the second erase pulse voltage when a vertical axis thereof denotes a voltage and a lateral axis denotes time has such a gradient that a gradient at a first point of time is not larger than a gradient at a second point of time before the first point of time through the width of the blunted wave-shape portion of the second erase pulse voltage, the blunted wave-shape portion being continuous to the saturation value of the second erase pulse voltage.

17. A non-volatile semiconductor storage device comprising:

a memory cell array including an electrically rewritable non-volatile memory cell arranged therein; and a control unit configured to perform controlling of repeating an erase operation to apply an erase pulse voltage to the memory cell for data erase and an erase verify operation to verify whether data erase k completed, and to cause the erase pulse voltage to increase by a certain step-up voltage in the erase operation performed again in the repeating of the erase operation and the erase verify operation after it is verified that data erase is not completed in the erase verify operation, the control unit being configured to, in the erase operations alternately repeated with the erase verify operation, perform a first erase operation as an initial one of the erase operations and, subsequent to the first erase operation, a second erase operation as a next one of the erase operations, the erase verify operation being performed between the first erase operation and the second erase operation, the control unit being configured to control the erase pulse voltage such that:

a first erase pulse voltage applied to the memory cell in the first erase operation is longer than a second erase pulse voltage applied to the memory cell in the second erase operation with respect to a width of a blunted wave-shape portion thereof, the blunted wave-shape portion being a single rise curve and continuous to a voltage value at a saturation state, the blunted wave-shape portion of the first erase pulse voltage including the single rise curve being followed by a substantially flat area having a first voltage value at the saturation state of the first erase pulse voltage, and the second erase pulse voltage has a second voltage value at the saturation state larger than the first voltage value at the saturation state of the first erase pulse voltage, wherein a relation of $Wp/3 \le t$ satisfied wherein Wp is a pulse width of the first erase pulse voltage, and t is the width of the blunted wave-shape portion of the first erase pulse voltage.

18. The non-volatile semiconductor storage device according to claim 17, wherein the control unit controls a voltage of the first erase pulse voltage such that the single rise curve is followed by a constant voltage at the saturation state or a progressively increased voltage to the saturation state.

* * * * *